United States Patent
Mittal et al.

(10) Patent No.: US 7,495,976 B2
(45) Date of Patent: Feb. 24, 2009

(54) REPAIRING INTEGRATED CIRCUIT MEMORY ARRAYS

(75) Inventors: Anurag Mittal, San Jose, CA (US); Jungtae Kwon, San Jose, CA (US)

(73) Assignee: ARM Limited, Cambridge (GB)

( * ) Notice: Subject to any disclaimer, the term of this patent is extended or adjusted under 35 U.S.C. 154(b) by 53 days.

(21) Appl. No.: 11/650,568

(22) Filed: Jan. 8, 2007

(65) Prior Publication Data

US 2008/0165609 A1    Jul. 10, 2008

(51) Int. Cl.
*G11C 29/00* (2006.01)
*G11C 17/18* (2006.01)
*G11C 8/00* (2006.01)

(52) U.S. Cl. ............... 365/200; 365/225.7; 365/230.03; 365/230.06

(58) Field of Classification Search ............... 365/200, 365/225.7, 230.03, 230.06
See application file for complete search history.

(56) References Cited

U.S. PATENT DOCUMENTS

| 5,724,282 | A  | * | 3/1998 | Loughmiller et al. ......... 365/96 |
| 2005/0128830 | A1 | * | 6/2005 | Nishihara et al. ........... 365/200 |
| 2006/0062483 | A1 | * | 3/2006 | Kondo et al. ................ 382/253 |
| 2006/0098508 | A1 | * | 5/2006 | Choi et al. .................. 365/203 |

* cited by examiner

*Primary Examiner*—Ly D Pham
(74) *Attorney, Agent, or Firm*—Nixon & Vanderhye P.C.

(57) ABSTRACT

A memory array 2 has an address decoder 12 responsive to a repair signal to operate either in a normal mode or a repair mode. In the normal mode a data bit is stored within a single memory cell 6. In the repair mode a data bit is stored within multiple memory cells 6 of a common column of memory cells sharing bit lines 8. This provides increased defect resistance when operating in the repair mode at the cost of reduced memory capacity.

35 Claims, 6 Drawing Sheets

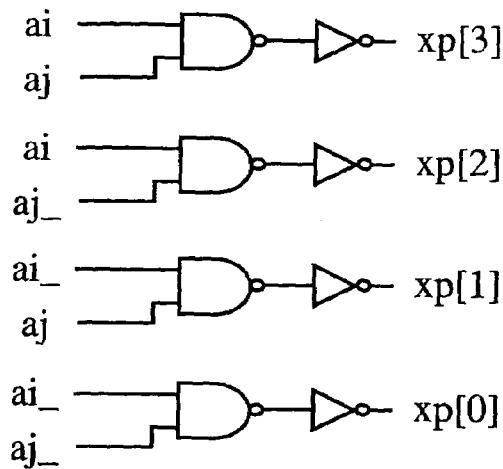
PRIOR ART Fig. 3
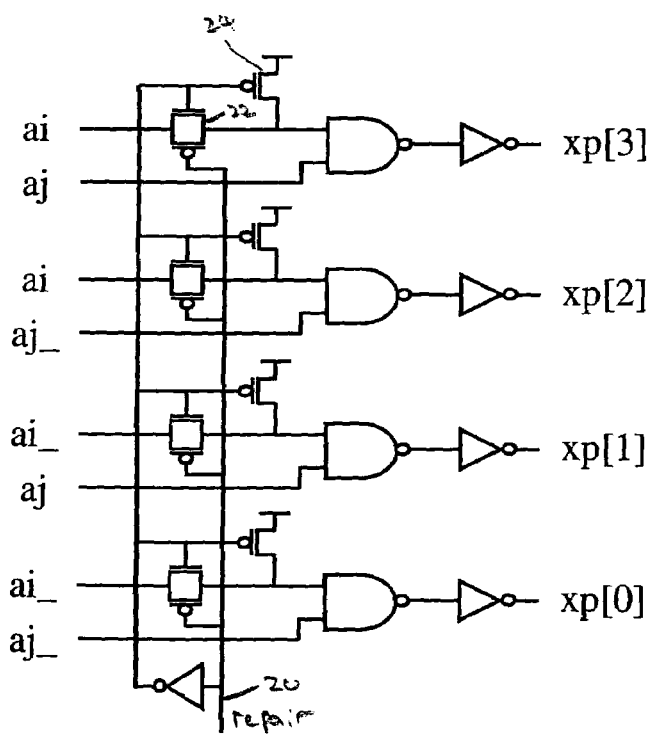
Fig. 4

REPAIRING INTEGRATED CIRCUIT MEMORY ARRAYS

BACKGROUND OF THE INVENTION

1. Field of the Invention

This invention relates to the field of memory arrays within integrated circuits. More particularly, this invention relates to the repair of defective circuits within memory arrays.

2. Description of the Prior Art

It is know to provide memory arrays with repair circuits which seek compensate for defective circuit elements within those memory arrays. As an example, it is known to provide redundant column and redundant row circuitry whereby, if a column or a row is defective, then it can be functionally substituted with a redundant column or a redundant row. Whilst these techniques are effective in improving the yield of useable integrated circuits, they suffer from the disadvantage of requiring additional circuit area overhead to provide the redundant columns and rows. Furthermore, a finite number such redundant columns may be provided and, if the number of defective rows or columns exceeds the number of redundant rows or columns, then repair then cannot be made and the integrated circuit cannot be used.

As process geometry is falling in size, the vulnerability of circuit elements within memory arrays to defects in their manufacture increases. As an example, the SRAM bits cell current on-to-off ratio has been decreasing rapidly as processed technology decreases in size. This reduction in the on-to-off ratio is primarily the result of sub-threshold leakage or "off" current of transistors used within such bit cells becoming a significant fraction of the "on" current due to what are commonly known as "short-channel" effects. Furthermore, the bit cell "on" current is not increasing in line with the historical scaling trends due to many reasons, including scaling limitations of gate oxide and threshold voltage. In addition, the increased significance of two dimensional electric field effects and other effects relating to the physics of operation of small scale circuit elements further increase the "off" current due to phenomenon such as gate tunneling and band-to-band tunneling which make the ratio of the on-to-off current even worse. As a consequence of the above factors, a bit cell being read might not be able to provide sufficient current for the bit line pair to develop a sufficient voltage differential during the time period required for sensing the stored data value. This would result in either an error in the state being read or the speed requirements for the memory not being met. If there is a large number of such bit cells within a single block of memory beyond the number that can be repaired by traditional redundancy techniques, then the integrated circuit will have to be discarded. It should be noted that the traditional redundancy schemes, and particularly redundant rows, have a significant area and timing overhead. In addition, they are ill suited to repairing for drifts in process parameters, weak or erratic bits or defects of a gross nature.

One approach to the above would be to design the memory arrays with a significant margin to cover expected process variations. However, as the process scales to smaller geometries, acceptable levels of margin in the design still result in a significant number of integrated circuits being produced which have errors beyond those which can be repaired by traditional row and column redundancy techniques. This problem is likely to become more severe as the geometries scale to smaller sizes.

SUMMARY OF THE INVENTION

Viewed from one aspect the present invention provides an integrated circuit comprising:

at least one array of memory cells having a plurality of rows of memory cells and a plurality of columns of memory cells;

a plurality of bit lines, each of said plurality of bit lines being coupled to a respective column of said memory cells;

a plurality of word lines carrying respective word line signals, each of said plurality of word lines being coupled to a respective row of said memory cells to control coupling of said respective row of memory cells to said plurality of bit lines so as to provide access to data bits stored therein;

an address decoder responsive to input memory addresses to generate said word line signals; and repair control circuitry responsive to a repair signal to control said address decoder during a memory access operation to an memory input address such that:

in a normal mode, a single row of memory cells is selected for access by one word line signal on one word line such that for each column of memory cells one memory cell is coupled to a corresponding bit line of said plurality of bit lines to provide access to a data bit as stored within said one memory cell; and in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells.

The present technique recognises that rather than discard an integrated circuit containing a memory array with defects that cannot be repaired in other ways, it is beneficial to instead salvage the integrated circuit by providing the capability to switch between a normal mode, in which a single bit cell which stores a data value, to a repair mode in which more than one memory cell (typically two) is used to store each data value. With multiple memory cells being used to store each data value there is an increased likelihood of the integrated circuit being able to be salvaged, although at the cost of reduced memory storage capability. The multiple memory cells used are normal functional memory cells. In contrast to the normal redundancy techniques in which defective memory cells are substituted by the memory cells in a redundant row with one data bit still being stored in one memory cell, the present technique overcomes the weakness of a given memory cell by combining it with another memory cell such that the two memory cells working together as a combined entity are able to properly function to store a data bit. The memory cells which are combined in this way share bit lines such that they can be read together through those shared bit lines and written together through those shared bit lines. It will be appreciated that whilst the memory array has a reduced storage capacity compared to the normal mode, in which a data bit is stored in a single memory cell, the repair mode provides a significantly reduced storage capacity due to the need to share memory cells to store a single data bit, but nevertheless provides a working integrated circuit which would otherwise have been scrap. It will be appreciated that this technique cannot repair all possible defects, but there are a significant number of types of defects which maybe overcome using this technique.

Whilst the address decoder can take a variety of different forms, a form in which the address decoder is formed of a pre-decoder and a word line decoder is well suited for adaptation in accordance with the current technique whereby the pre-decoder can be modified such that in the repair mode a single input memory address to the pre-decoder generates pre-decoded signals passes to the word line decoder that match pre-decoded signals that would be passed in response to decoding of a plurality of separate addresses when operating the normal mode. This conveniently allows multiple rows of memory cells to be simultaneously selected for connection to the word lines.

Whilst the repair control circuitry can take many forms, a simple and effective one is that it acts to set a plurality of the signals passed to the word line decoder to fixed values such that multiple word line selecting signals are generated by the word line decoder. It is convenient to set the signals corresponding to a most significant bit of an input address to be fixed values as this provides that two memory cells will be used to store each data bit and it is normal for memory addresses having a different most significant bit to physically correspond to widely space memory cells within the memory array in a manner in which reduces the likelihood that both memory cells will simultaneously be defective.

Whilst the present technique can be usefully employed within an integrated circuits including only a single array of memory cells, the technique is also useful within an integrated circuits containing multiple arrays of memory cells. In practice these different arrays of memory cells can be individually placed in normal mode or repair mode such that it is likely that only some of arrays will need to operate in the repair mode at reduced storage capacity thereby salvaging what might otherwise have been a scrap integrated circuit and yet only losing storage capacity within some of the arrays of memory cells.

Within the context of integrated circuits containing a plurality of arrays of memory cells, an array select signal can be used to control the repair control circuitry to select one of the plurality of arrays of memory cells to operated in the repair mode. A single array requiring repair by operating in the repair mode is statistically the most likely occurrence and accordingly simplifying the repair control circuitry to operating in this manner represents a good trade off between complexity and usefulness.

It will be appreciated that when operating in the repair mode whilst sharing memory cells to drive values out onto the bit lines may increase read speed, the need to write into more than one memory cell during a write could reduce write speed and accordingly it is desirable to provide a write signal driver of increased strength and of at least sufficient strength to write to the number of memory cells which act together in the repair mode.

The same issue can also be addressed by providing timing and control circuitry able to extend the write cycle time and potentially reduce the read cycle time.

It will be appreciated that the repair signal may be generated in a number of different ways and may, for example, be a signal from an external pin of the integrated circuit or a signal generated by a fusible link within the integrated circuit or a combination. The array select signals may also be generated in a similar way, either by one or more external pins or one or more fusible links or a combination.

The present technique is applicable to arrange of different types of memory array, such as arrays having a single bit line per memory cell, bit line pairs per memory cell, DRAM memory, SRAM memory and other types of memory.

It will also be appreciated that whilst the present technique can be used upon integrated circuits comprising dedicated memory integrated circuits, the technique is also useful within integrated circuits carrying a variety of other on-chip elements, such as general purpose processors and the like as is increasingly commonly found within so called system-on-chip integrated circuits.

Viewed from another aspect the present invention provides an integrated circuit comprising:

at least one array of memory cell means having a plurality of rows of memory cell means and a plurality of columns of memory cell means;

a plurality of bit line means, each of said plurality of bit line means being coupled to a respective column of said memory cell means;

a plurality of word line means carrying respective word line signals, each of said plurality of word line means being coupled to a respective row of said memory cell means to control coupling of said respective row of memory cell means to said plurality of bit line means so as to provide access to data bits stored therein;

address decoder means for generating said word line signals in response to input memory addresses; and repair control means for controlling said address decoder means during a memory access operation to an input memory address and a repair signal such that:

in a normal mode, a single row of memory cell means is selected for access by one word line signal on one word line means such that for each column of memory cell means one memory cell means is coupled to a corresponding bit line means of said plurality of bit line means to provide access to a data bit as stored within said one memory cell means; and in a repair mode, a plurality of rows of memory cell means are selected for access by a plurality of word line signals on a plurality of word line means such that for each column of memory cell means a plurality of memory cell means are coupled to said corresponding bit line means of said plurality of bit line means to provide access to said data bit as stored within said plurality of memory cell means.

Viewed from a further aspect the present invention provides a method of operating an integrated circuit having at least one array of memory cells with a plurality of rows of memory cells and a plurality of columns of memory cells, a plurality of bit lines, each of said plurality of bit lines being coupled to a respective column of said memory cells, a plurality of word lines carrying respective word line signals, each of said plurality of word lines being coupled to a respective row of said memory cells to control coupling of said respective row of memory cells to said plurality of bit lines so as to provide access to data bits stored therein and an address decoder responsive to input memory addresses to generate said word line signals; said method comprising in response to a repair signal, controlling said address decoder during a memory access operation to an input memory address such that:

in a normal mode, a single row of memory cells is selected for access by one word line signal on one word line such that for each column of memory cells one memory cell is coupled to a corresponding bit line of said plurality of bit lines to provide access to a data bit as stored within said one memory cell; and in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 schematically illustrates a pre-decoder of a known form;

FIG. 4 schematically illustrates the pre-decoder of FIG. 3 modified to operate in accordance with one example of the present techniques;

DESCRIPTION OF THE PREFERRED EMBODIMENTS

Figure 1:
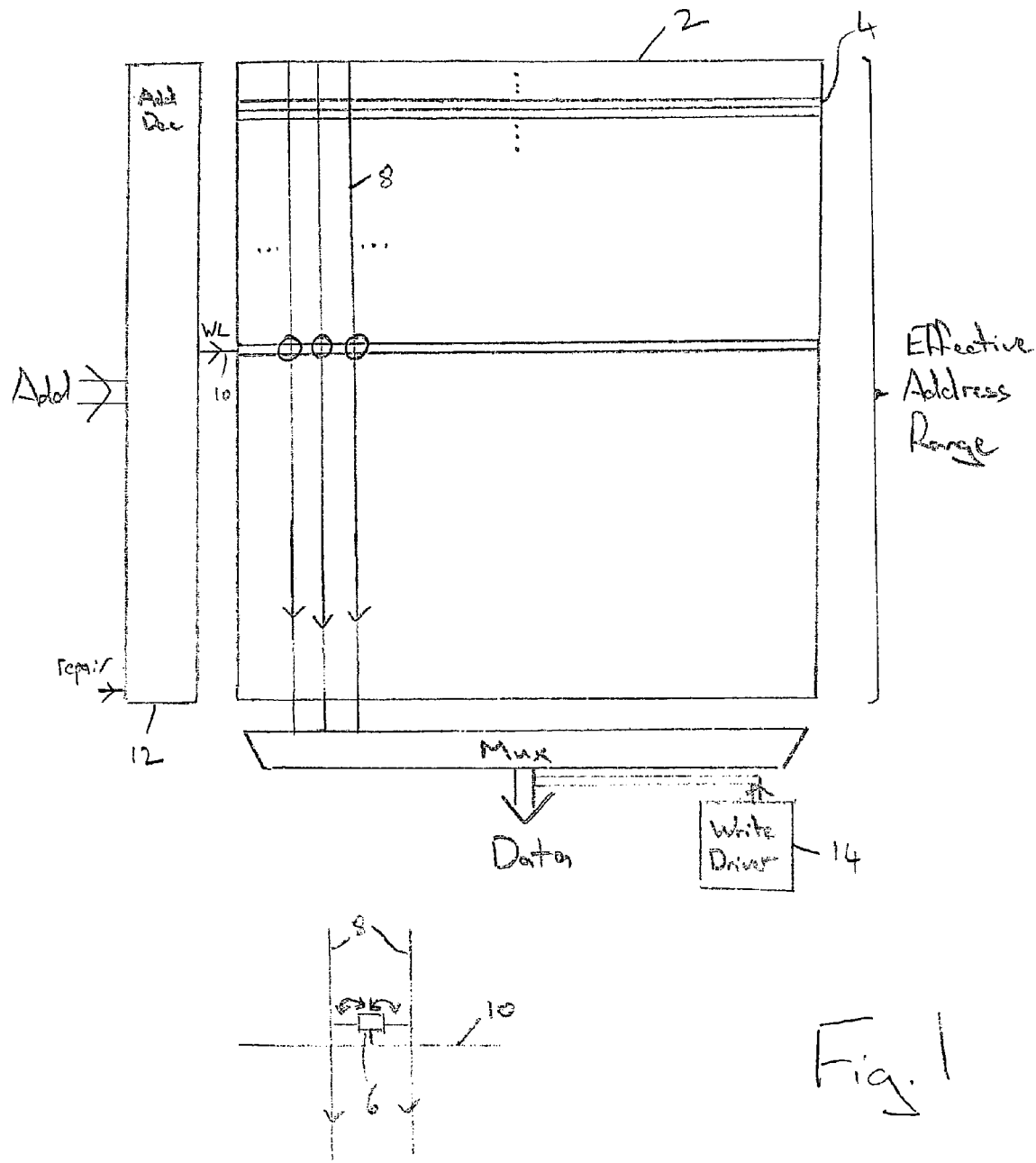
FIG. 1 schematically illustrates a memory array operating in a normal mode.

FIG. 1 schematically illustrates a memory array 2 comprising a plurality of rows of memory cells 4. An individual memory cell 6 is shown in expanded form coupled to a bit line pair 8 and a word line 10. It will be appreciated that the memory array 2 can be considered to be formed of a plurality of rows of memory cells, those memory cells also lining up to form a plurality of columns of memory cells 4. The memory cells of a given column of memory cells are coupled to the same bit lines 8 which run along the column. The memory cells 6 within a row of memory cells 4 share a common word line 10. When an address decoder 12 decodes an input address (or part of such an address), it operates in a normal mode of operation to generate a single word line select signal on a single word line 10 which connects the memory cells 6 within that row with the bit lines of their respective columns. When the memory cells 6 are connected to the bit lines 8, data can be read out of the memory cell 6 or written into the memory cells 6 depending upon whether a read operation or a write operation is being performed. When a write operation is being performed, a write driver circuit 14 acts to drive the appropriate voltage levels onto the bit lines 10 for a write cycle period in order for the desired data bits to be captured and stored within the selected memory cell 6. The operation of the memory array 2 illustrated in the normal mode in FIG. 1 is conventional and will be familiar to workers in this technical field. It will be noted that the effective address range of the memory array 2 in the normal mode spans the full memory array 2.

Figure 2:
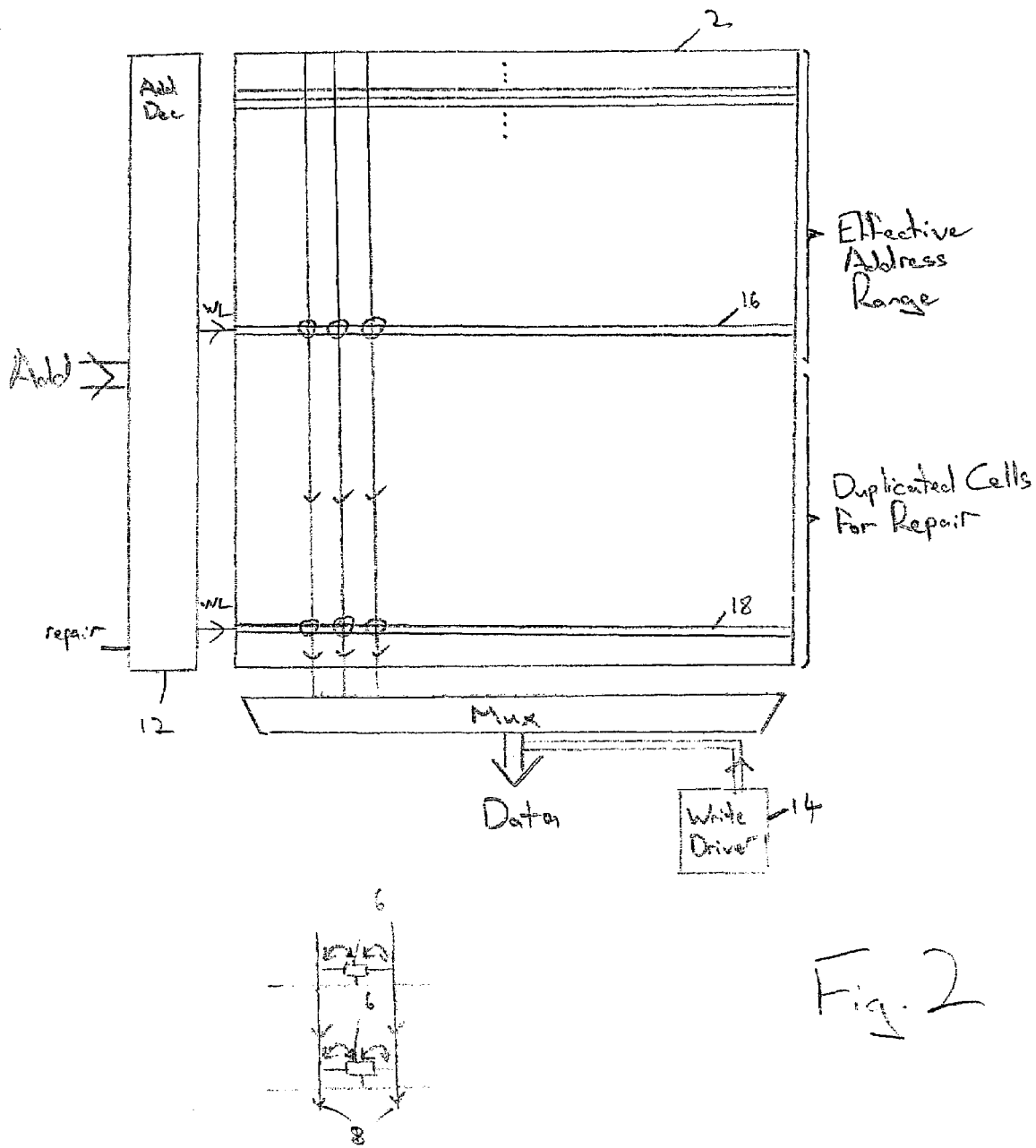
FIG. 2 schematically illustrates a memory array operating in a repair mode.

FIG. 2 illustrates the memory array 2 of FIG. 1 operating in a repair mode. In the repair mode a single address input to the address decoder 12 results in two word line signals being generated and supplied to two separate rows of memory cells 16, 18. The memory cells 6 of both of these rows of memory cells 16, 18 are connected to the bit lines 8 of the column of memory cells in which they lie. As illustrated in expanded form in FIG. 2, the memory cells 6 from both rows 16, 18 serve to drive the bit lines 8 when the operation is a read and accordingly weakness in one of the memory cells 6 may be compensated for by the other of the memory cells 6. When the operation is a write, the data value being generated by the write driver 14 is written into both of the memory cells 6. In this way, it will be seen that a given data bit is stored within two memory cells 6 in this example embodiment and these two memory cells are simultaneously connected to the bit lines during read and write operations. Also illustrated in FIG. 2 is the effective address range of the memory array 2 in the repair mode. Since each data bit requires two memory cells 6 for its storage, the storage capacity of the memory array 2 in the repair mode is halved and thus the effective address range is shown as halved with the remainder of the memory array 2 being used for the duplicated cells.

It will be appreciated that whilst the example of FIG. 2 shows a given data bit been stored in two memory cells, it would be possible for the data bit to be stored in more than two memory cells, but this would be at the cost of further reducing the storage capacity.

FIG. 3 schematically illustrates a known type of pre-decoder that can form part of the address decoder 12. This is a 4-to-1 decoder in which two address bits ai, aj are input in both true and inverted form to four NAND gates and serve to generate a select signal on one of the outputs. This type of pre-decoder will be familiar to those in this technical field.

FIG. 4 illustrates a modification of the pre-decoder of FIG. 3 in accordance with one example of the current techniques. A repair signal is input on signal line 20 and serves to render non-conductive transition gates 22 relating to one of the input address bits ai and tie off the corresponding inputs to the NAND gates to a fixed level using the transistors 24. Thus, for any given address input to the pre-decoder of FIG. 4, two of the output signals will be active (i.e. corresponding to the input of two different addresses) and accordingly multiple word line signals will be generated when the word line decoder acts upon the output of the pre-decoder.

Figure 5:
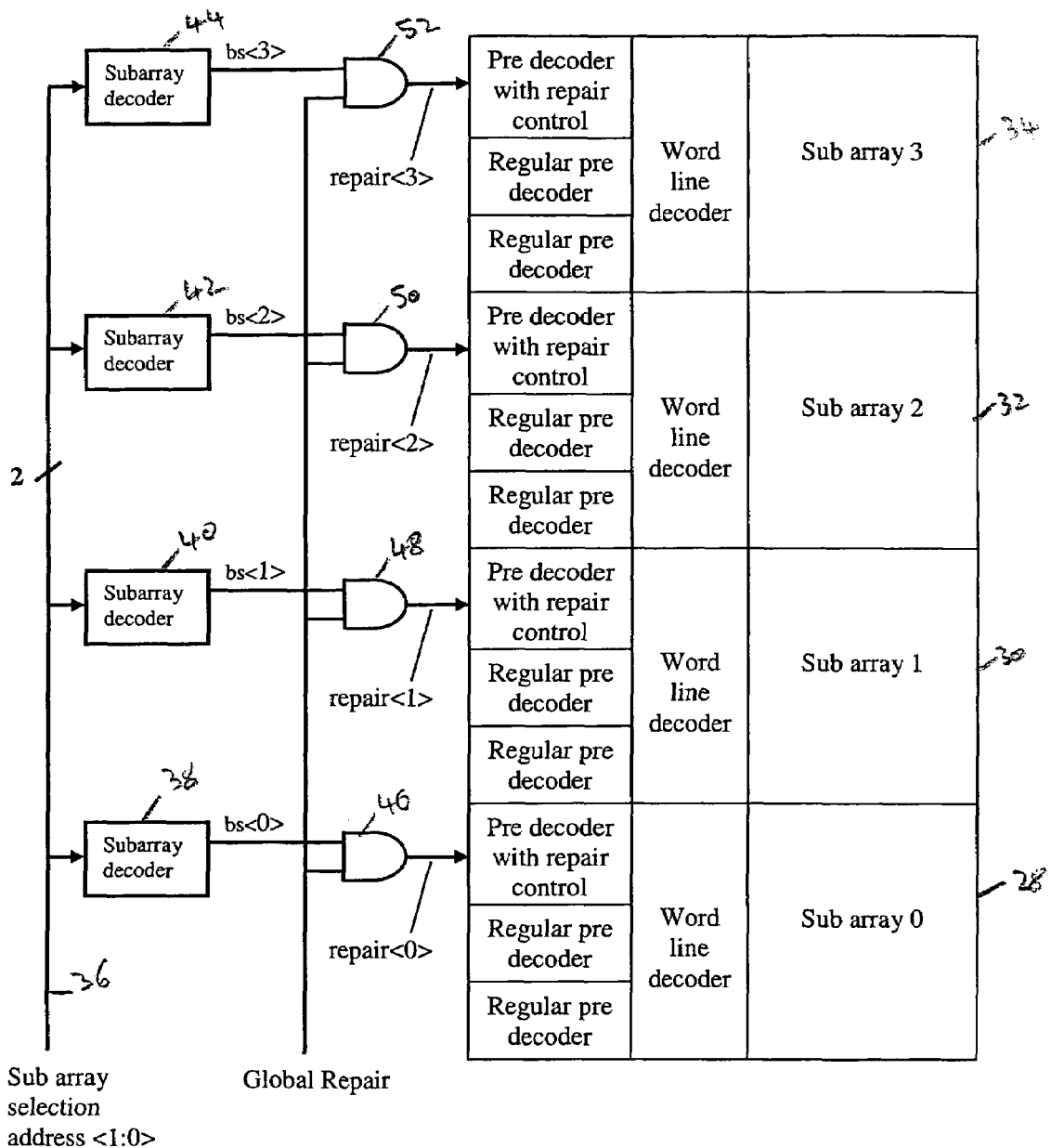
FIG. 5 schematically illustrates a memory incorporating multiple memory arrays each using one example of the current repair technique.

FIG. 5 illustrates a memory 26 comprising a plurality of memory arrays 28, 30, 32, 34 each of which can separately be placed into the repair mode if required. An array selecting signal input online 36 is a two-bit signal indicating which of the memory arrays 28, 30, 32, 34 is to be placed in repair mode. In this example embodiment, only a single memory array 28, 30, 32, 34 can be placed into the repair mode at any one time, but it would be possible in other embodiments to have multiple arrays simultaneously in the repair mode if desired. However, it will be most common only to need to place one array into the repair mode at any given time. Sub-array decoders 38, 40, 42, 44 are associated with each array 28, 30, 32, 34 serve to decode the array select signal and generate an output if a match occurs. This output is ANDed with a global repair signal by AND gates 46, 48, 50, 52 to generate a repair signal for the particular sub-arrays. This repair signal is fed to the pre-decoder of the particular sub-array concerned and processed as illustrated in FIG. 4. It will be appreciated that the array select signal 36 and the global repair signal can be input via external pins of the integrated circuit or maybe generated internally by fusible links or a combination of these techniques.

Figure 6:
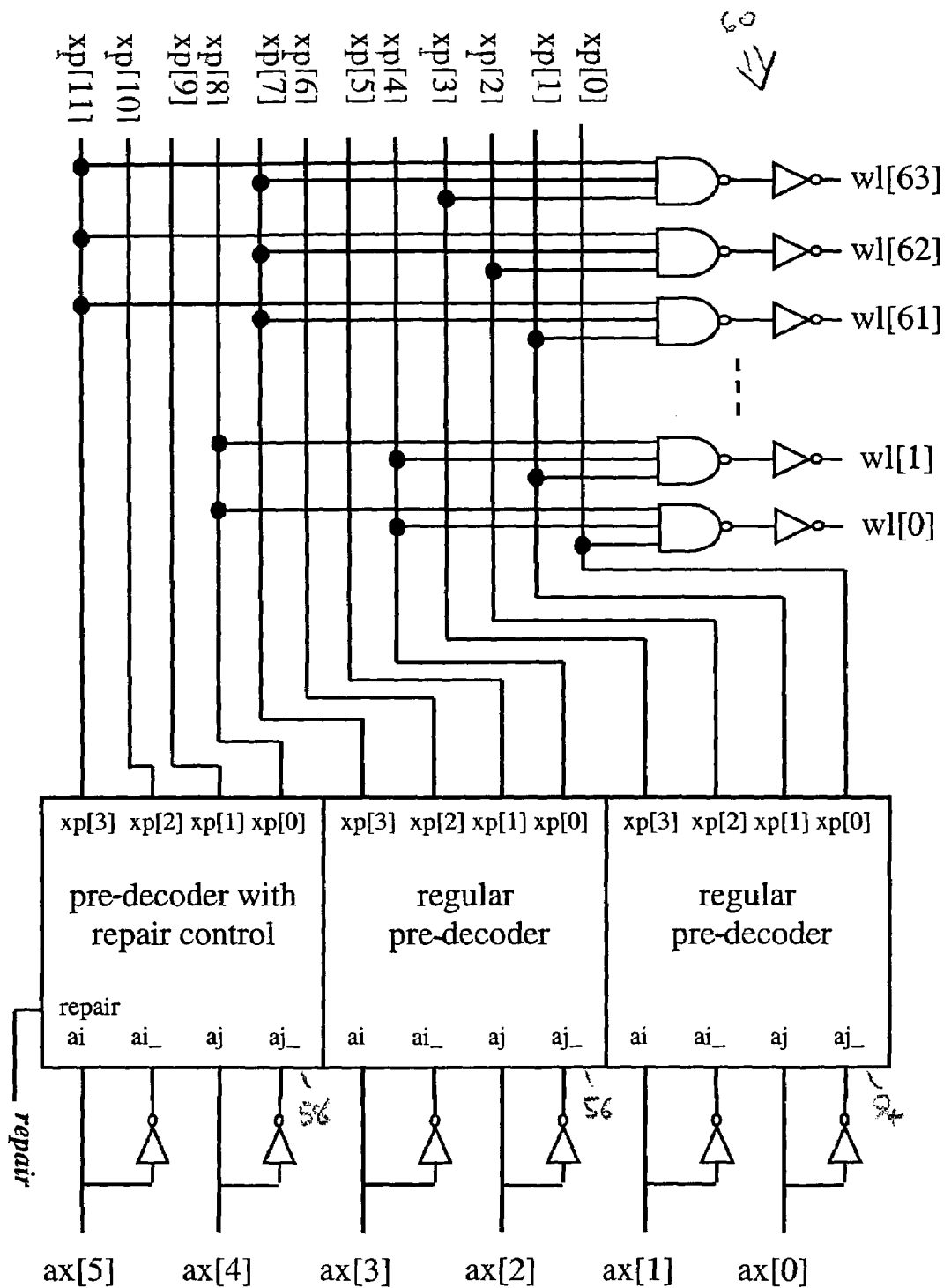
FIG. 6 illustrates a pre-decoder and word line decoder using one example of the present techniques.

FIG. 6 illustrates an address decoder having a plurality of pre-decoders 54, 56, 58 and a word line decoder 60. In this example, only the pre-decoder 58 is subject to having its action modified by the repair signal as this will be sufficient to ensure two word line signals will be generated in the repair mode thereby activating two rows of memory cells when required. It will be seen in FIG. 6 that the word line decoder 60 comprises a set of 3-input NAND gates connected to respective combinations of output signals of the pre-decoders 54, 56, 58 to generate sixty four different respective word line signals. The word line decoder 60 is one suited for a memory array having 64 rows of memory cells. It will be appreciated that depending upon the form and size of the memory array concerned, the address decoder illustrated in FIG. 6 could take a variety of different forms. The repair signal serving in these different forms when active will cause two word line signals to be asserted for each input address in a manner in which will cause the bit line signals to be shared by two memory cells 6.

Figure 7:
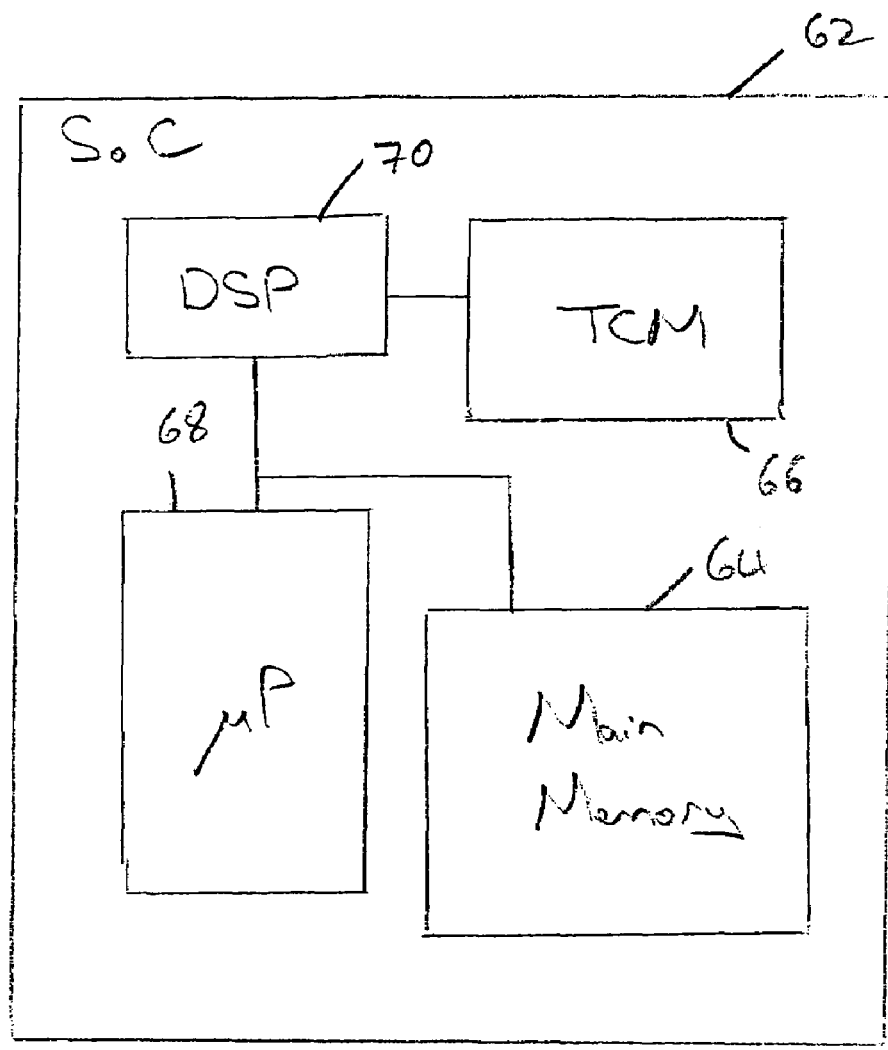
FIG. 7 schematically illustrates a system-on-chip integrated circuit incorporating multiple memory arrays.

FIG. 7 schematically illustrates an integrated circuit 62 in a form of a system-on-chip including multiple memory arrays comprising a main memory 64 and a tightly coupled memory 66. Also provided upon the integrated circuit 62 are a general purpose microprocessor 68 and a digital signal processor 70 (which may contain additional memory and other circuit elements). FIG. 7 is schematic and it will be appreciated that such an integrated circuit will typically contain many further circuit elements. The multiple memory arrays 64, 66 provided upon the integrated circuit 62 can be in the form SRAM, DRAM or other forms of memory, such as ROM. Each of these different memory arrays 64, 66 can separately use the repair mode technique described above or it maybe that only one of these memory 64, 66 needs to use this technique.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
    at least one array of memory cells having a plurality of rows of memory cells and a plurality of columns of memory cells;
    a plurality of bit lines, each of said plurality of bit lines being coupled to a respective column of said memory cells;
    a plurality of word lines carrying respective word line signals, each of said plurality of word lines being coupled to a respective row of said memory cells to control coupling of said respective row of memory cells to said plurality of bit lines so as to provide access to data bits stored therein;
    an address decoder responsive to input memory addresses to generate said word line signals; and
    repair control circuitry responsive to a repair signal to control said address decoder during a memory access operation to an memory input address such that:
        in a normal mode, a single row of memory cells is selected for access by one word line signal on one word line such that for each column of memory cells one memory cell is coupled to a corresponding bit line of said plurality of bit lines to provide access to a data bit as stored within said one memory cell;
        in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells; and
    a plurality of arrays of memory cells, said repair control circuitry independently controlling different ones of said plurality of arrays of memory cells to operate in said normal mode or said repair mode.

2. An integrated circuit as claimed in claim 1, wherein in said normal mode, said address decoder generates said one word line signal for each input memory address; and in said repair mode, said address decoder generates said plurality of word line signals for each input memory address.

3. An integrated circuit as claimed in claim 1, wherein in said repair mode, two memory cells from different rows of memory cells and in a shared column of memory cells are coupled to said corresponding bit line to provide access to said data bit.

4. An integrated circuit as claimed in claim 1, wherein said repair control circuitry is responsive to an array select signal to select one of said plurality of arrays of memory cells to operate in said repair mode, remaining ones of said plurality of arrays of memory cells being thereby selected to operate in said normal mode.

5. An integrated circuit as claimed in claim 4, wherein said array select signals is one of:
    received at one or more external pins of said integrated circuit; and
    generated in dependence upon one or more fusible links within said integrated circuit.

6. An integrated circuit as claimed in claim 1, wherein said at least one memory array is one of:
    a DRAM memory array; and
    an SRAM memory array.

7. An integrated circuit as claimed in claim 1, wherein said integrated circuit comprises a system-on-chip integrated circuit including said one or more arrays of memory cells and one or more data processing circuits for performing data processing operations upon data values stored within said one or more arrays of memory cells.

8. An integrated circuit comprising:
    at least one array of memory cells having a plurality of rows of memory cells and a plurality of columns of memory cells;
    a plurality of bit lines, each of said plurality of bit lines being coupled to a respective column of said memory cells;
    a plurality of word lines carrying respective word line signals, each of said plurality of word lines being coupled to a respective row of said memory cells to control coupling of said respective row of memory cells to said plurality of bit lines so as to provide access to data bits stored therein;
    an address decoder responsive to input memory addresses to generate said word line signals; and
    repair control circuitry responsive to a repair signal to control said address decoder during a memory access operation to an memory input address such that:
        in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
        in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells, wherein said repair signal is one of:
    a signal received at an external pin of said integrated circuit; and
    a signal generated in dependence upon a fusible link within said integrated circuit.

9. An integrated circuit comprising:
at least one array of memory cells having a plurality of rows of memory cells and a plurality of columns of memory cells;
a plurality of bit lines, each of said plurality of bit lines being coupled to a respective column of said memory cells;
a plurality of word lines carrying respective word line signals, each of said plurality of word lines being coupled to a respective row of said memory cells to control coupling of said respective row of memory cells to said plurality of bit lines so as to provide access to data bits stored therein;
an address decoder responsive to input memory addresses to generate said word line signals;
repair control circuitry responsive to a repair signal to control said address decoder during a memory access operation to an memory input address such that:
in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells; and
a write signal driver coupled to said plurality of bits lines to generate write signals to be written in to selected memory cells, said write signal driver having a drive strength at least sufficient to write said data bit to said plurality of memory cells in said repair mode.

10. An integrated circuit comprising:
at least one array of memory cells having a plurality of rows of memory cells and a plurality of columns of memory cells;
a plurality of bit lines, each of said plurality of bit lines being coupled to a respective column of said memory cells;
a plurality of word lines carrying respective word line signals, each of said plurality of word lines being coupled to a respective row of said memory cells to control coupling of said respective row of memory cells to said plurality of bit lines so as to provide access to data bits stored therein;
an address decoder responsive to input memory addresses to generate said word line signals;
repair control circuitry responsive to a repair signal to control said address decoder during a memory access operation to an memory input address such that:
in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells; and
timing control circuitry for controlling a write cycle time of write operations and a read cycle time of read operations.

11. An integrated circuit as claimed in claim 10, wherein said timing control circuitry extends said write cycle time in said repair mode.

12. An integrated circuit as claimed in claim 10, wherein said timing control circuitry reduces said read cycle time in said repair mode.

13. An integrated circuit comprising:
at least one array of memory cells having a plurality of rows of memory cells and a plurality of columns of memory cells;
a plurality of bit lines, each of said plurality of bit lines being coupled to a respective column of said memory cells;
a plurality of word lines carrying respective word line signals, each of said plurality of word lines being coupled to a respective row of said memory cells to control coupling of said respective row of memory cells to said plurality of bit lines so as to provide access to data bits stored therein;
an address decoder responsive to input memory addresses to generate said word line signals;
repair control circuitry responsive to a repair signal to control said address decoder during a memory access operation to an memory input address such that:
in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells, wherein said address decoder comprises a pre-decoder and a word line decoder, said repair control circuitry controlling said pre-decoder such that in said repair mode in response to a single input memory address said pre-decoder generates pre-decoded signals passed to said word line decoder that match pre-decoded signals passed to said word line decoder for a plurality of separate addresses when operating in said normal mode.

14. An integrated circuit as claimed in claim 3, wherein said repair control circuitry is responsive to said repair signal to set to respective fixed values a plurality of signals input to said word line decoder.

15. An integrated circuit as claimed in claim 14, wherein said repair control circuitry is responsive to said repair signal to set to fixed values a plurality of signals input to said word line decoder corresponding to a most significant bit of said input memory address.

16. A method of operating an integrated circuit having at least one array of memory cells with a plurality of rows of memory cells and a plurality of columns of memory cells, a plurality of bit lines, each of said plurality of bit lines being coupled to a respective column of said memory cells, a plurality of word lines carrying respective word line signals, each of said plurality of word lines being coupled to a respective row of said memory cells to control coupling of said respective row of memory cells to said plurality of bit lines so as to provide access to data bits stored therein and an address decoder responsive to input memory addresses to generate said word line signals; said method comprising the steps of:

in response to a repair signal, controlling said address decoder during a memory access operation to an input memory address such that:

in a normal mode, a single row of memory cells is selected for access by one word line signal on one word line such that for each column of memory cells one memory cell is coupled to a corresponding bit line of said plurality of bit lines to provide access to a data bit as stored within said one memory cell; and in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells; and generating write signals to be written in to selected memory cells, said write signals having a drive strength at least sufficient to write said data bit to said plurality of memory cells in said repair mode.

17. An integrated circuit comprising:

at least one array of memory cell means having a plurality of rows of memory cell means and a plurality of columns of memory cell means;

a plurality of bit line means, each of said plurality of bit line means being coupled to a respective column of said memory cell means;

a plurality of word line means carrying respective word line signals, each of said plurality of word line means being coupled to a respective row of said memory cell means to control coupling of said respective row of memory cell means to said plurality of bit line means so as to provide access to data bits stored therein;

address decoder means for generating said word line signals in response to input memory addresses; and repair control means for controlling said address decoder means during a memory access operation to an input memory address and a repair signal such that:

in a normal mode, a single row of memory cell means is selected for access by one word line signal on one word line means such that for each column of memory cell means one memory cell means is coupled to a corresponding bit line means of said plurality of bit line means to provide access to a data bit as stored within said one memory cell means; and in a repair mode, a plurality of rows of memory cell means are selected for access by a plurality of word line signals on a plurality of word line means such that for each column of memory cell means a plurality of memory cell means are coupled to said corresponding bit line means of said plurality of bit line means to provide access to said data bit as stored within said plurality of memory cell means; and a plurality of arrays of memory cell means, said repair control means independently controlling different ones of said plurality of arrays of memory cell means to operate in said normal mode or said repair mode.

18. A method of operating an integrated circuit having at least one array of memory cells with a plurality of rows of memory cells and a plurality of columns of memory cells, a plurality of bit lines, each of said plurality of bit lines being coupled to a respective column of said memory cells, a plurality of word lines carrying respective word line signals, each of said plurality of word lines being coupled to a respective row of said memory cells to control coupling of said respective row of memory cells to said plurality of bit lines so as to provide access to data bits stored therein and an address decoder responsive to input memory addresses to generate said word line signals; said method comprising in response to a repair signal, controlling said address decoder during a memory access operation to an input memory address such that:

in a normal mode, a single row of memory cells is selected for access by one word line signal on one word line such that for each column of memory cells one memory cell is coupled to a corresponding bit line of said plurality of bit lines to provide access to a data bit as stored within said one memory cell; and in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells; and independently controlling different ones of a plurality of arrays of memory cells of said integrated circuit to operate in said normal mode or said repair mode.

19. A method as claimed in claim 18, wherein in said normal mode, said address decoder generates said one word line signal for each input memory address; and in said repair mode, said address decoder generates said plurality of word line signals for each input memory address.

20. A method as claimed in claim 18, wherein in said repair mode, two memory cells from different rows of memory cells and in a shared column of memory cells are coupled to said corresponding bit line to provide access to said data bit.

21. A method as claimed in claim 18, further comprising in response to an array select signal selecting one of said plurality of arrays of memory cells to operate in said repair mode, remaining ones of said plurality of arrays of memory cells being thereby selected to operate in said normal mode.

22. A method as claimed in claim 21, wherein said array select signals is one of:

received at one or more external pins of said integrated circuit; and generated in dependence upon one or more fusible links within said integrated circuit.

23. A method as claimed in claim 18, wherein said at least one memory array is one of:

a DRAM memory array; and an SRAM memory array.

24. A method as claimed in claim 18, wherein said integrated circuit comprises a system-on-chip integrated circuit including said one or more arrays of memory cells and one or more data processing circuits for performing data processing operations upon data values stored within said one or more arrays of memory cells.

25. A method of operating an integrated circuit having at least one array of memory cells with a plurality of rows of memory cells and a plurality of columns of memory cells, a plurality of bit lines, each of said plurality of bit lines being coupled to a respective column of said memory cells, a plurality of word lines carrying respective word line signals, each of said plurality of word lines being coupled to a respective row of said memory cells to control coupling of said respective row of memory cells to said plurality of bit lines so as to provide access to data bits stored therein and an address decoder responsive to input memory addresses to generate said word line signals; said method comprising the steps of:

in response to a repair signal, controlling said address decoder during a memory access operation to an input memory address such that:
  in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
  in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells, wherein said address decoder comprises a pre-decoder and a word line decoder, further comprising controlling said pre-decoder such that in said repair mode in response to a single input memory address said pre-decoder generates pre-decoded signals passed to said word line decoder that match pre-decoded signals passed to said word line decoder for a plurality of separate addresses when operating in said normal mode.

26. A method as claimed in claim 25, further comprising in response to said repair signal setting to respective fixed values a plurality of signals input to said word line decoder.

27. A method as claimed in claim 26, wherein further comprising in response to said repair signal setting to fixed values a plurality of signals input to said word line decoder corresponding to a most significant bit of said input memory address.

28. A method of operating an integrated circuit having at least one array of memory cells with a plurality of rows of memory cells and a plurality of columns of memory cells, a plurality of bit lines, each of said plurality of bit lines being coupled to a respective column of said memory cells, a plurality of word lines carrying respective word line signals, each of said plurality of word lines being coupled to a respective row of said memory cells to control coupling of said respective row of memory cells to said plurality of bit lines so as to provide access to data bits stored therein and an address decoder responsive to input memory addresses to generate said word line signals; said method comprising the steps of:
  in response to a repair signal, controlling said address decoder during a memory access operation to an input memory address such that:
    in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
    in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells; and
  controlling a write cycle time of write operations and a read cycle time of read operations.

29. A method as claimed in claim 28, further comprising extending said write cycle time in said repair mode.

30. A method as claimed in claim 28, further comprising reducing said read cycle time in said repair mode.

31. A method of operating an integrated circuit having at least one array of memory cells with a plurality of rows of memory cells and a plurality of columns of memory cells, a plurality of bit lines, each of said plurality of bit lines being coupled to a respective column of said memory cells, a plurality of word lines carrying respective word line signals, each of said plurality of word lines being coupled to a respective row of said memory cells to control coupling of said respective row of memory cells to said plurality of bit lines so as to provide access to data bits stored therein and an address decoder responsive to input memory addresses to generate said word line signals; said method comprising the steps of:
  in response to a repair signal, controlling said address decoder during a memory access operation to an input memory address such that:
    in a normal mode, a single row of memory cells is selected for access by one word line signal on one word line such that for each column of memory cells one memory cell is coupled to a corresponding bit line of said plurality of bit lines to provide access to a data bit as stored within said one memory cell; and
    in a repair mode, a plurality of rows of memory cells are selected for access by a plurality of word line signals on a plurality of word lines such that for each column of memory cells a plurality of memory cells are coupled to said corresponding bit line of said plurality of bit lines to provide access to said data bit as stored within said plurality of memory cells, wherein said repair signal is one of a signal received at an external pin of said integrated circuit; and a signal generated in dependence upon a fusible link within said integrated circuit.

32. An integrated circuit comprising:
  at least one array of memory cell means having a plurality of rows of memory cell means and a plurality of columns of memory cell means;
  a plurality of bit line means, each of said plurality of bit line means being coupled to a respective column of said memory cell means;
  a plurality of word line means carrying respective word line signals, each of said plurality of word line means being coupled to a respective row of said memory cell means to control coupling of said respective row of memory cell means to said plurality of bit line means so as to provide access to data bits stored therein;
  address decoder means for generating said word line signals in response to input memory addresses; and
  repair control means for controlling said address decoder means during a memory access operation to an input memory address and a repair signal such that:
    in a normal mode, a single row of memory cell means is selected for access by one word line signal on one word line means such that for each column of memory cell means one memory cell means is coupled to a corresponding bit line means of said plurality of bit line means to provide access to a data bit as stored within said one memory cell means; and
    in a repair mode, a plurality of rows of memory cell means are selected for access by a plurality of word line signals on a plurality of word line means such that for each column of memory cell means a plurality of memory cell means are coupled to said corresponding bit line means of said plurality of bit line means to provide access to said data bit as stored within said plurality of memory cell means, wherein said address decoder means comprises a pre-decoder means and a word line decoder means, said repair control means controlling said pre-decoder means such that in said repair mode in response to a single input memory address said pre-decoder means generates pre-decoded signals passed to said word line decoder means that match pre-decoded signals passed to said word line decoder means for a plurality of separate addresses when operating in said normal mode.

33. An integrated circuit comprising:

at least one array of memory cell means having a plurality of rows of memory cell means and a plurality of columns of memory cell means;

a plurality of bit line means, each of said plurality of bit line means being coupled to a respective column of said memory cell means;

a plurality of word line means carrying respective word line signals, each of said plurality of word line means being coupled to a respective row of said memory cell means to control coupling of said respective row of memory cell means to said plurality of bit line means so as to provide access to data bits stored therein;

address decoder means for generating said word line signals in response to input memory addresses; and repair control means for controlling said address decoder means during a memory access operation to an input memory address and a repair signal such that:

in a normal mode, a single row of memory cell means is selected for access by one word line signal on one word line means such that for each column of memory cell means one memory cell means is coupled to a corresponding bit line means of said plurality of bit line means to provide access to a data bit as stored within said one memory cell means; and in a repair mode, a plurality of rows of memory cell means are selected for access by a plurality of word line signals on a plurality of word line means such that for each column of memory cell means a plurality of memory cell means are coupled to said corresponding bit line means of said plurality of bit line means to provide access to said data bit as stored within said plurality of memory cell means; and a write signal driver means coupled to said plurality of bits lines for generating write signals to be written in to selected memory cell means, said write signal driver means having a drive strength at least sufficient to write said data bit to said plurality of memory cell means in said repair mode.

34. An integrated circuit comprising:

at least one array of memory cell means having a plurality of rows of memory cell means and a plurality of columns of memory cell means;

a plurality of bit line means, each of said plurality of bit line means being coupled to a respective column of said memory cell means;

a plurality of word line means carrying respective word line signals, each of said plurality of word line means being coupled to a respective row of said memory cell means to control coupling of said respective row of memory cell means to said plurality of bit line means so as to provide access to data bits stored therein;

address decoder means for generating said word line signals in response to input memory addresses; and repair control means for controlling said address decoder means during a memory access operation to an input memory address and a repair signal such that:

in a normal mode, a single row of memory cell means is selected for access by one word line signal on one word line means such that for each column of memory cell means one memory cell means is coupled to a corresponding bit line means of said plurality of bit line means to provide access to a data bit as stored within said one memory cell means; and in a repair mode, a plurality of rows of memory cell means are selected for access by a plurality of word line signals on a plurality of word line means such that for each column of memory cell means a plurality of memory cell means are coupled to said corresponding bit line means of said plurality of bit line means to provide access to said data bit as stored within said plurality of memory cell means; and timing control means for controlling a write cycle time of write operations and a read cycle time of read operations.

35. An integrated circuit comprising:

at least one array of memory cell means having a plurality of rows of memory cell means and a plurality of columns of memory cell means;

a plurality of bit line means, each of said plurality of bit line means being coupled to a respective column of said memory cell means;

a plurality of word line means carrying respective word line signals, each of said plurality of word line means being coupled to a respective row of said memory cell means to control coupling of said respective row of memory cell means to said plurality of bit line means so as to provide access to data bits stored therein;

address decoder means for generating said word line signals in response to input memory addresses; and repair control means for controlling said address decoder means during a memory access operation to an input memory address and a repair signal such that:

in a normal mode, a single row of memory cell means is selected for access by one word line signal on one word line means such that for each column of memory cell means one memory cell means is coupled to a corresponding bit line means of said plurality of bit line means to provide access to a data bit as stored within said one memory cell means; and in a repair mode, a plurality of rows of memory cell means are selected for access by a plurality of word line signals on a plurality of word line means such that for each column of memory cell means a plurality of memory cell means are coupled to said corresponding bit line means of said plurality of bit line means to provide access to said data bit as stored within said plurality of memory cell means; and wherein said repair signal is one of a signal received at an external pin means of said integrated circuit; and a signal generated in dependence upon a fusible link means within said integrated circuit.

* * * * *